United States Patent
Son

(10) Patent No.: US 7,030,036 B2
(45) Date of Patent: Apr. 18, 2006

(54) METHOD OF FORMING OXIDE LAYER IN SEMICONDUCTOR DEVICE

(75) Inventor: Ho Min Son, Icheon-Shi (KR)

(73) Assignee: Hynix Semiconductor Inc., Kyungki-Do (KR)

(*) Notice: Subject to any disclaimer, the term of this patent is extended or adjusted under 35 U.S.C. 154(b) by 0 days.

(21) Appl. No.: 10/880,282

(22) Filed: Jun. 29, 2004

(65) Prior Publication Data

US 2005/0142889 A1    Jun. 30, 2005

(30) Foreign Application Priority Data

Dec. 30, 2003  (KR) .................. 10-2003-0100172

(51) Int. Cl.
  *H01L 21/31* (2006.01)
  *H01L 21/469* (2006.01)
(52) U.S. Cl. .............. 438/758; 438/745; 438/775; 438/906
(58) Field of Classification Search ............ 438/758, 438/745, 906, 775, 766, 769, 770
See application file for complete search history.

(56) References Cited

U.S. PATENT DOCUMENTS

| 5,151,375 A | * | 9/1992 | Kazerounian et al. ...... 438/262 |
| 6,194,267 B1 | * | 2/2001 | Kaya ........................... 438/257 |
| 2002/0001968 A1 | * | 1/2002 | Lee et al. .................... 438/745 |
| 2003/0027433 A1 | * | 2/2003 | Faur et al. ................... 438/770 |

FOREIGN PATENT DOCUMENTS

KR    1020050003535 A    1/2005

* cited by examiner

*Primary Examiner*—Caridad Everhart
(74) *Attorney, Agent, or Firm*—Marshall, Gerstein & Borun LLP

(57) ABSTRACT

Provided is related to a method of forming an oxide layer of a semiconductor device. In the method, a first oxide layer is formed with a first thickness on a semiconductor substrate, that is comparted into first and second fields, and then a second oxide layer is formed on the first field with a second thickness, while preventing damages on the surface of the semiconductor substrate, after removing the first oxide layer on the first field. By the method, oxide layers different in thickness can be formed in separate field on the semiconductor substrate, without damages due to an etching process while enhancing the physical quality of the oxide layers.

20 Claims, 4 Drawing Sheets

METHOD OF FORMING OXIDE LAYER IN SEMICONDUCTOR DEVICE

BACKGROUND

1. Field of the Invention

The present invention relates to a method of forming oxide layers, and more particularly, to a method of forming oxide layers different in thickness each other on an identical layer.

2. Discussion of Related Art

In general, a flash memory device needs oxide layers which are different in their thickness. That is, the flash memory device includes high-voltage operational elements and low-voltage operational elements in accordance with an operation voltage employed therein. The high-voltage operational elements are necessary to be associated with thick oxide layers, while the low-voltage operational elements are necessary to be associated with thin oxide layers. Such needs for different oxide layers dependent on the operation voltage brought a dual-gate oxidation process, which processing steps are as follows.

FIGS. 1A through 1C are sectional views illustrating a method of forming oxide layers in a semiconductor device, in accordance with a conventional technique.

Referring to FIG. 1A, a first oxide layer 102 is formed on a semiconductor substrate 101 where it is comparted into a field for memory cells and low-voltage operational elements (hereinafter, referred to as "first field") and a field for high-voltage operational elements (hereinafter, referred to as "second field"). The first oxide layer 102 is formed to make a gate oxide layer of the high-voltage operational element.

Referring to FIG. 1B, after forming an etch-stopping layer 103 on the second field, the first oxide layer 102 is removed from the first field. During this, it is general for the etch-stopping layer 103 to be formed by means of a photo-resistive pattern.

Meantime, the first oxide layer 102 on the first field can be removed by an etching process using a BOE (Buffered Oxide Etchant).

Referring to FIG. 1C, the etch-stopping layer 103 is also removed. Thereafter, a second oxide layer 104 is deposited on the first field. While this, it is occurred that the second oxide layer 104 is partially formed on the first oxide later 102 of the second field. The second oxide layer 104 is formed to make a tunnel oxide layer of a memory cell or a gate oxide layer of the low-voltage operational element.

From the processing steps, the first and second oxide layers are formed with different thickness each other.

However, with such a method for forming the oxide layers different in thickness, the surface of the semiconductor substrate 101 may be exposed when removing the first oxide layer as shown in FIG. 1A. During this, the BOE causes damages on the surface of the semiconductor substrate 101. Further, according to a longer processing time with the BOE, the surface of the semiconductor substrate 101 becomes harsher to may result in generating micro-trenches (not shown). As a result, the second oxide layer 104 degrades with its physical quality, causing electrical characteristics of the low-voltage operational elements to be worse.

SUMMARY OF THE INVENTION

Accordingly, the present invention is directed to a method of forming oxide layers in a semiconductor device by which a first oxide layer is formed with a first thickness entirely on a semiconductor substrate that is comparted into first and second fields.

And then, after partially removing the first oxide layer from the first field, remaining the first oxide layer with a predetermined thickness in order to protect a surface of the semiconductor substrate, the first oxide layer is completely removed by way of a cleaning process before oxidation and a second oxide layer is formed on the first field with a second thickness.

In another method, after removing the first oxide layer from the first field and forming a passivation oxide layer by oxidizing a damaged surface of the first field of the semiconductor substrate, the passivation oxide layer is completely removed by way of a cleaning process before oxidation and a second oxide layer is formed on the first field with a second thickness.

By the processes, oxide layers different in thickness can be formed in separate field on the semiconductor substrate, without damages due to an etching process while preventing degradation of the physical quality of the oxide layers.

A method of forming oxide layer in a semiconductor device, in accordance with an exemplary embodiment of the present invention, comprises the steps of: forming a first oxide layer on a semiconductor substrate comparted into a low-voltage operational element field and a high-voltage operational element field; partially etching the first oxide layer from the low-voltage operational element field by a predetermined thickness by means of an etching process, remaining the first oxide layer in a target thickness; completely removing the first oxide layer by means of a pre-cleaning process; and forming a second oxide layer on the low-voltage operational element field.

In the embodiment, it is preferred for the remaining target thickness of the first oxide layer to be 20 Å through 100 Å and it is preferred for using a BOE in an etching process.

In a pre-cleaning process, it may use a $H_2SO_4$ solution, a mixed HF solution, and a SC-1 solution.

As another embodiment of the present invention, a method of forming oxide layer in a semiconductor device comprises the steps of: forming a first oxide layer on a semiconductor substrate comparted into a low-voltage operational element field and a high-voltage operational element field; removing the first oxide layer from the low-voltage operational element field; forming a passivation oxide layer by oxidizing a surface of the semiconductor substrate in the low-voltage operational element field with an oxidation process, in order to eliminate damages on the surface of the semiconductor substrate in the low-voltage operational element field; removing the passivation oxide layer by means of a pre-cleaning process; and forming a second oxide layer on the low-voltage operational element field.

In this embodiment, it is available to further comprise, before forming the first oxide layer, the step of proceeding a cleaning process for removing garbage or a native oxides layer remaining on a surface of the semiconductor substrate. The cleaning process may use an HF solution mixed with a ratio of 10:1 through 100:1, and a SC-1 solution.

The first oxide layer may be formed by a wet oxidation process in temperature of 750° C. through 850° C. with thickness of 200 Å through 400 Å.

The passivation oxide layer is preferred to be formed with thickness of 20 Å through 100 Å, using a wet oxidation process in temperature of 750° C. through 850° C., or a dry oxidation process in temperature of 800° C. through 1050° C.

The pre-cleaning process may use at least more than one among a $H_2SO_4$ solution, a mixed HF solution, and a SC-1 solution. Otherwise, the pre-cleaning process is operable with using the H2SO4 solution, the mixed HF solution, and the SC-1 solution, in order, with using the SC-1 solution after the mixed HF solution, or with using the mixed HF solution after the SC-1 solution.

The second oxide may be formed by a wet oxidation process in temperature of 750° C. through 850° C., or by a dry oxidation process in temperature of 800° C. through 1100° C.

In this embodiment, it may further comprise, after forming the second oxide layer, the step of forming the second oxide layer into an oxy-nitride layer by proceeding an annealing process with nitrogen.

The annealing process with nitrogen may be carried out with supply of an NO gas or an $N_2O$ gas for five through thirty minutes, under pressure of 300 Torr through 760 Torr and in temperature of 800° C. through 1100° C.

The annealing process with nitrogen is preferred to be carried out in-situ.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art.

In the embodiments, a description that a certain layer is "on" another layer or a semiconductor substrate is desired to be understood like that the certain layer is directly contact to said another layer or the semiconductor substrate, or like that a third layer is interposed between the certain layer and said another layer or the semiconductor substrate. And, in drawings, the dimensions or thicknesses for layers will be magnified for convenience of explanation and clearness. Like numerals refer to like elements throughout the specification.

Hereinafter, it will be described about embodiments of the present invention in conjunction with the accompanying drawings.

FIGS. 2A through 2D are sectional views illustrating a method of forming oxide layers in a semiconductor device, in accordance with an exemplary embodiment of the present invention.

Figure 1A:
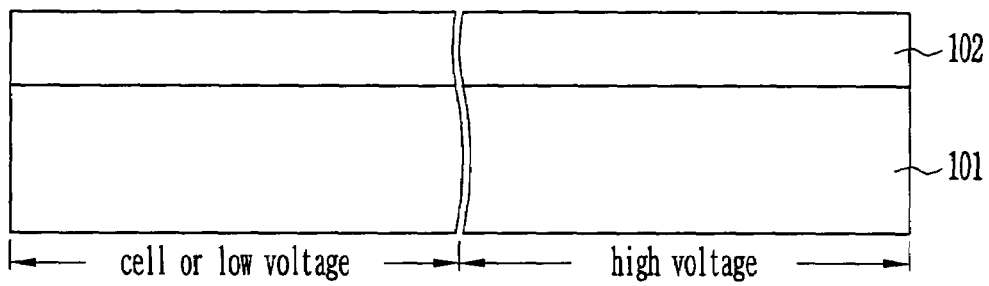
FIGS. 1A through 1C are sectional views illustrating a method of forming oxide layers in a semiconductor device, in accordance with a conventional technique.
Figure 1B:
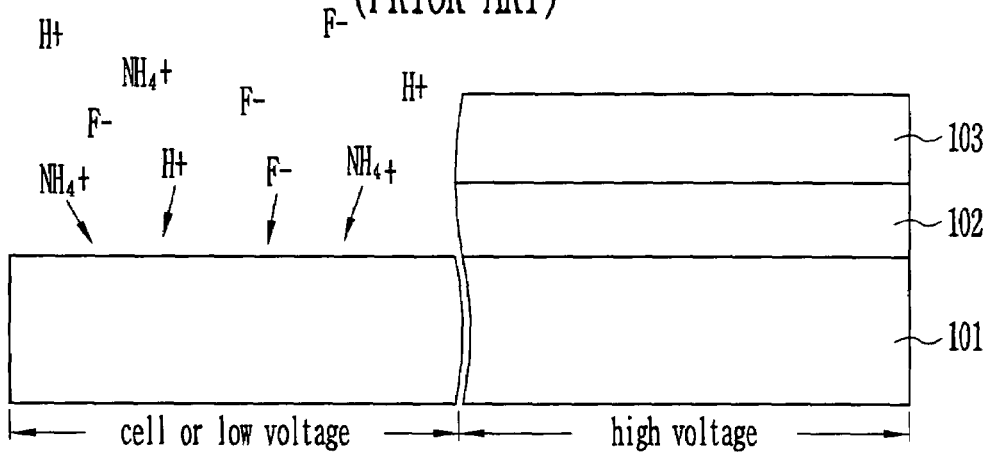
Figure 1C:
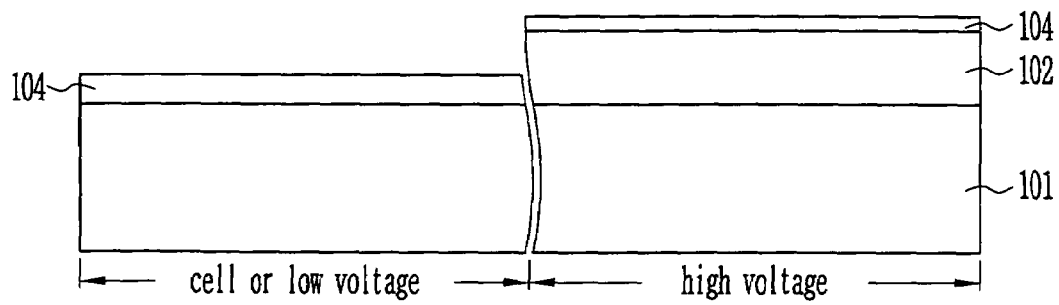
Figure 2A:
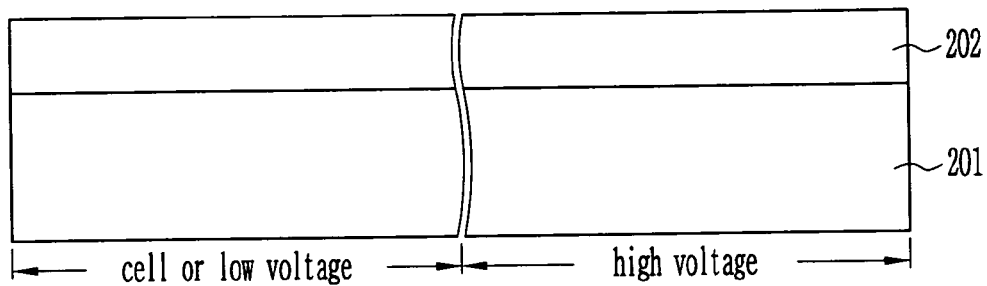
FIGS. 2A through 2D are sectional views illustrating a method of forming oxide layers in a semiconductor device, in accordance with an exemplary embodiment of the present invention.

Referring to FIG. 2A, a first oxide layer 202 is formed on an overall structure of a semiconductor substrate 201, being comparted into a field for memory cells and low-voltage operational elements (hereinafter, referred to as "first field") and a field for high-voltage operational elements (hereinafter, referred to as "second field"), which contains ion implantation regions (not shown) for controlling threshold voltages of circuit elements and wells formed by means of an ion implantation process. The first oxide layer 202 is formed to make a gate oxide layer of the high-voltage operational element.

The first oxide layer 202 may be formed by a wet oxidation process in temperature of 750° C. through 850° C. with thickness of 200 Å through 400 Å.

Meantime, it is available to conduct a cleaning process for removing garbage or native oxides remaining on the surface of the semiconductor substrate before forming the first oxide layer 202. During the cleaning process, an HF solution mixed with the ratio of 10:1 through 100:1 or an SC-1 solution may be used. The SC-1 solution is made of a compound of $NH_4OH/H_2O_2/H_2O$.

Figure 2B:
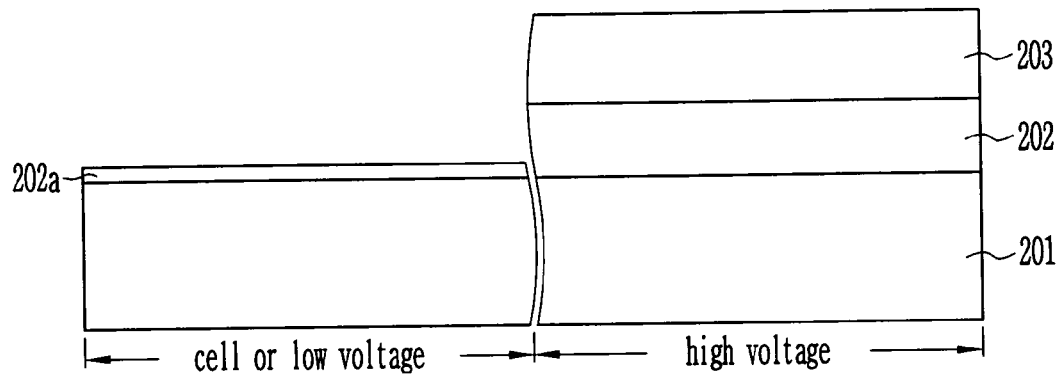

Referring to FIG. 2B, an etch-stopping layer 203 is formed on the second field. Here, it is general for the etch-stopping layer 203 to be formed by means of a photo-resistive pattern.

Next, the first oxide layer 202 is partially removed from the first field with a predetermined thickness so as to result in a remaining oxide layer 202a of the first oxide layer 202 just by a target thickness. During this, a BOE (Buffered Oxide Etchant) containing $NH_4F$ and HF may be used to etch the first oxide layer away from the first field.

The target thickness of the remaining oxide layer 202a is desired to be 20 Å through 100 Å. If the remaining oxide layer 202a of the first oxide layer 202 is thinner than 20 Å, it may cause damages on the surface of the semiconductor substrate 201. On the other hand, if the remaining oxide layer 202a of the first oxide layer 202 is thicker than 100 Å, it makes it difficult to completely remove the remaining oxide layer 202a in a subsequent process.

Figure 2C:
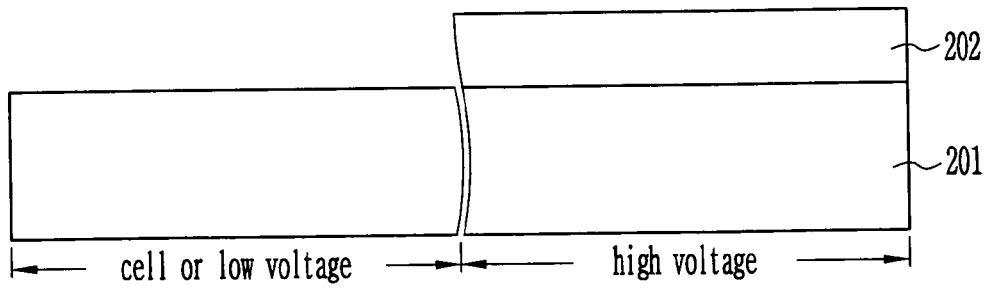

Referring to FIG. 2C, the etch-stopping layer 203 is removed. Next, a pre-cleaning process, which is usually carried out before forming a gate oxide layer of a transistor and a tunnel oxide layer of a flash memory cell, is conducted to remove the remaining oxide later 202a from the first field.

During the pre-cleaning process, an $H_2SO_4$ solution, a mixed HF solution, or an SC-1 solution may be used to wholly remove the etch-stopping layer 203 and carbon adhesive to the surface of the semiconductor substrate 201, the remaining oxide layer 202a as well. It is preferred for the HF solution to be mixed with the ratio of 10:1 through 100:1. The SC-1 solution is made of a compound of $NH_4OH/H_2O_2/H_2O$.

In primary, the pre-cleaning process is oriented to remove garbage remaining on the surface of the semiconductor substrate 201 or a native oxide layer formed thin on the semiconductor substrate 201, not to etch an oxide layer away. Therefore, there are no damages on the surface of the semiconductor substrate 201 even when such a pre-cleaning process is carried out thereto.

Thus, by completely removing the remaining oxide layer 202a of the first oxide layer 202 after partially etching the first oxide layer 202 to leave the remaining oxide layer 202a, the oxide layer on the first field is removed in whole without damaging the surface of the semiconductor substrate 201.

Figure 2D:
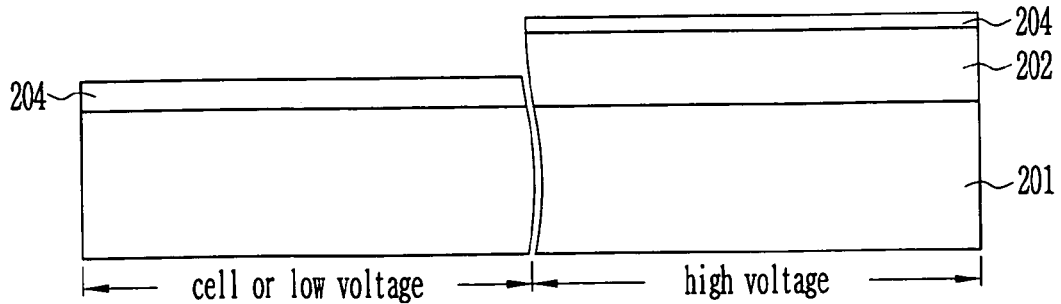

Referring to FIG. 2D, a second oxide layer 204 is formed on the first field. While this, the second oxide layer 204 may be partially formed on the first oxide layer 202 of the second field. If the second oxide layer 204 is assigned to be a tunnel oxide layer of a memory cell or a gate oxide layer of a low-voltage operational element (e.g., transistor), it is formed with being thinner than the first oxide layer 202.

The second oxide layer 204 is formed with the thickness of 10 Å through 60 Å by means of oxidation. After conducting the oxidation process, an annealing process with nitrogen may be carried out to form the second oxide layer 204 into an oxy-nitride layer. Here, the oxidation process may be carried out in 750° C. through 850° C. under a wet condition or in 900° C. through 1100° C. under a dry condition. After then, the annealing process with nitrogen is desirable to proceed with supply of NO or $N_2O$ gas for five through thirty minutes, in detail further under the pressure of 300 Torr through 760 Torr and the temperature of 800° C. through 1100° C. It is also preferable for the annealing process with nitrogen to be carried out in-situ in the same chamber with maintaining the same vacuum state.

As a result, the oxide layers 202 and 204 different in thickness are formed without damages on the surface of the semiconductor substrate 201 due to the etching process.

FIGS. 3A through 3E are sectional views illustrating a method of forming oxide layers in a semiconductor device, in accordance with another embodiment of the present invention.

Figure 3A:
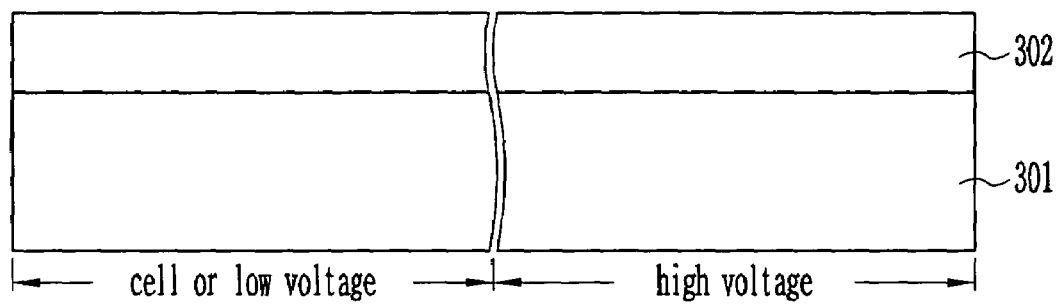
FIGS. 3A through 3E are sectional views illustrating a method of forming oxide layers in a semiconductor device, in accordance with another embodiment of the present invention.

Referring to FIG. 3A, a first oxide layer 302 is formed on an overall structure of a semiconductor substrate 301, being comparted into a field for memory cells and low-voltage operational elements (hereinafter, referred to as "first field") and a field for high-voltage operational elements (hereinafter, referred to as "second field"), which contains ion implantation regions (not shown) for controlling threshold voltages of circuit elements and wells formed by means of an ion implantation process. The first oxide layer 302 is formed to make a gate oxide layer of the high-voltage operational element.

The first oxide layer 302 may be formed by a wet oxidation process in temperature of 750° C. through 850° C. with thickness of 200 Å through 400 Å.

Meantime, it is available to conduct a cleaning process for removing garbage or native oxides remaining on the surface of the semiconductor substrate before forming the first oxide layer 302. During the cleaning process, an HF solution mixed with the ratio of 10:1 through 100:1 or an SC-1 solution may be used. The SC-1 solution is made of a compound of $NH_4OH/H_2O_2/H_2O$.

Figure 3B:
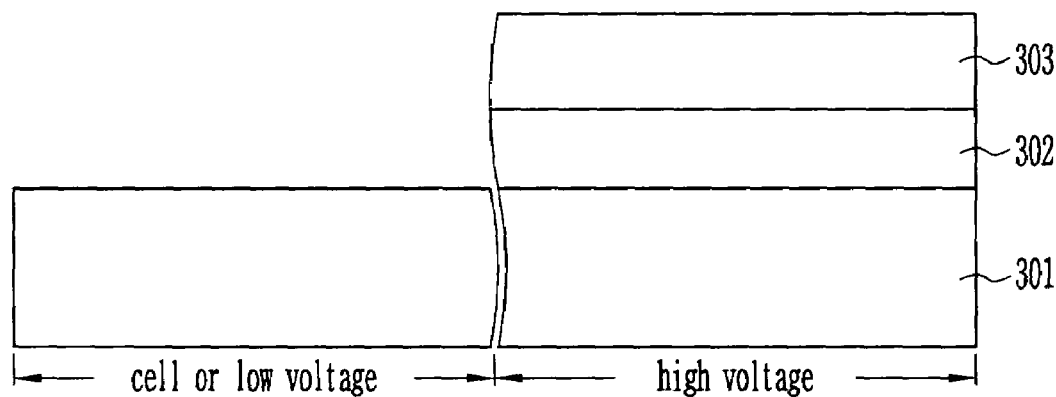

Referring to FIG. 3B, an etch-stopping layer 303 is formed on the second field. Here, it is general for the etch-stopping layer 303 to be formed by means of a photo-resistive pattern.

Next, the first oxide layer 302 is removed from the first field with a predetermined. During this, a BOE (Buffered Oxide Etchant) containing $NH_4F$ and HF may be used to etch the first oxide layer away from the first field. Otherwise, a plasma etching process with $CF_4/O_2/Ar$ gas may be used to etch the first oxide layer 302 from the first field.

Figure 3C:
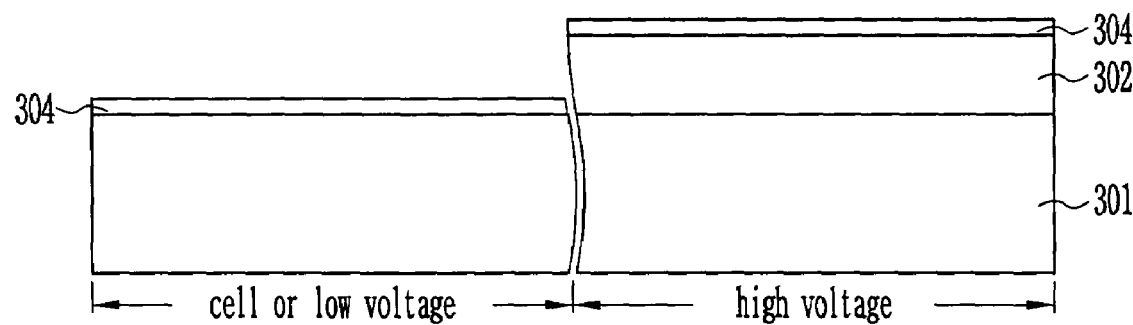

Referring to FIG. 3C, the etch-stopping layer 303 is removed. Next, a passivation oxide layer 304 is formed on the surface of the semiconductor substrate 301 by oxidizing the surface of the semiconductor substrate 301 by the thickness damaged during the former etching process for the first oxide layer 302, in order to cure the damage arising while the firs oxide layer 302 is etched away. The passivation oxide layer 304 may be oxidized in 750° C. through 850° C. under a wet condition or in 800° C. through 1050° C. under a dry condition, with the thickness of 20 Å through 100 Å. If the passivation oxide layer 304 is thinner than 20 Å, it is insufficient to completely eliminate damages on the surface of the semiconductor substrate 301. On the other hand, if the remaining oxide layer 304 is thicker than 100 Å, it makes it difficult to completely remove the passivation oxide layer 304 in a subsequent process.

Figure 3D:
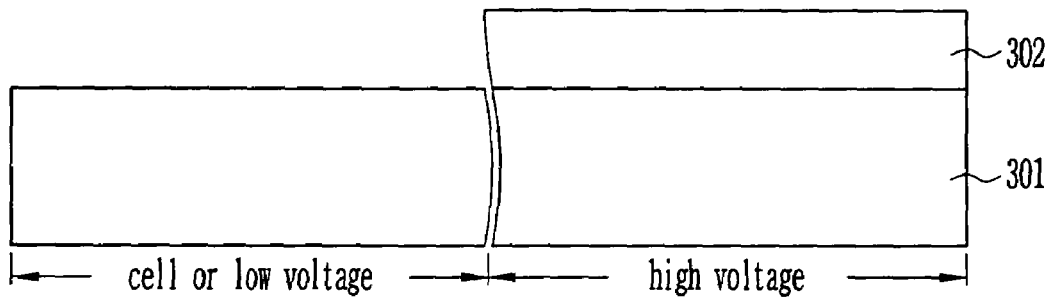

Referring to FIG. 3D, a pre-cleaning process, which is usually carried out before forming a gate oxide layer of a transistor and a tunnel oxide layer of a flash memory cell, is conducted to remove the passivation oxide later 304 from the first field.

During the pre-cleaning process for the passivation oxide layer 304, one or more among an $H_2SO_4$ solution, a mixed HF solution and a SC-1 solution may be used and the sequence of using the solutions may be properly arranged in accordance with processing conditions. For instance, it is available to make a sequence such as using $H_2SO_4$, the mixed HF, and SC-1, in order, using SC-1 after the mixed HF, or using the mixed HF after SC-1. It is preferred for the HF solution to be mixed with the ratio of 10:1 through 100:1. The SC-1 solution is made of a compound of $NH_4OH/H_2O_2/H_2O$.

The pre-cleaning process wholly removes the etch-stopping layer 303 and carbon adhesive to the surface of the semiconductor substrate 301, as well as the passivation oxide layer 304.

In reference, the pre-cleaning process is oriented to remove garbage remaining on the surface of the semiconductor substrate 301 or a native oxide layer formed thin on the semiconductor substrate 301, not to etch an oxide layer away. Therefore, there are no damages on the surface of the semiconductor substrate 301 even when such a pre-cleaning process is carried out thereto.

Thus, by completely removing the passivation oxide layer 304 by the pre-cleaning process after forming the passivation oxide layer 304 in a proper thickness by the oxidation process, it eliminates damages that have been generated on the surface of the semiconductor substrate 301.

Figure 3E:
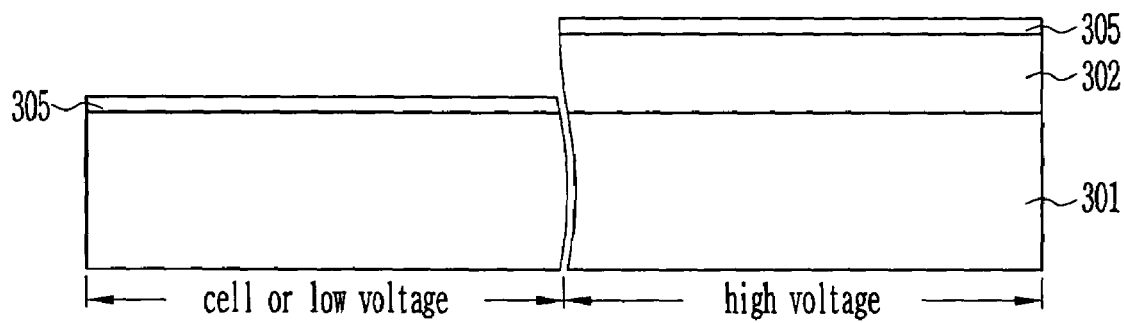

Referring to FIG. 3E, a second oxide layer 305 is formed on the first field. While this, the second oxide layer 305 may be partially formed on the first oxide layer 302 of the second field. If the second oxide layer 305 is assigned to be a tunnel oxide layer of a memory cell or a gate oxide layer of a low-voltage operational element (e.g., transistor), it is formed with being thinner than the first oxide layer 302.

The second oxide layer 305 is formed with the thickness of 30 Å through 100 Å by means of an oxidation process. After conducting the oxidation process, an annealing process with nitrogen may be carried out to form the second oxide layer 305 into an oxy-nitride layer. Here, the oxidation process may be carried out in 750° C. through 850° C. under a wet condition or in 900° C. through 1100° C. under a dry condition. After then, the annealing process with nitrogen is desirable to proceed with supply of NO or $N_2O$ gas for five through thirty minutes, in detail further under the pressure of 300 Torr through 760 Torr and the temperature of 800° C. through 1100° C. It is also preferable for the annealing process with nitrogen to be carried out in-situ in the same chamber with maintaining the same vacuum state.

As a result, the oxide layers 302 and 305 different in thickness are formed without damages on the surface of the semiconductor substrate 301 due to the etching process.

As aforementioned, the present invention provides a method of forming oxide layers, in which a first oxide layer is formed with a first thickness on a semiconductor substrate compartmented into first and second fields, and then a second oxide layer is formed on the first field with a second thickness, while preventing damages on the surface of the semiconductor substrate, after removing the first oxide layer on the first field. By the method, oxide layers different in thickness can be formed in separate field on the semiconductor substrate, without damages due to an etching process while enhancing the physical quality of the oxide layers.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of forming oxide layer in a semiconductor device, comprising the steps of: forming a first oxide layer on a semiconductor substrate divided into a low-voltage operational element field and a high-voltage operational element field; partially etching the first oxide layer from the low-voltage operational element field by a predetermined thickness by means of an etching process, wherein the first oxide layer retains a remaining target thickness; removing the first oxide layer by means of a pre-cleaning process; and forming a second oxide layer on the low-voltage operational element field.

2. The method of claim 1, wherein the remaining target thickness of the first oxide layer is 20 Å through 100 Å.

3. The method of claim 1, wherein the etching process uses a BOE.

4. The method of claim 1, wherein the pre-cleaning process uses an $H_2SO_4$ solution, a mixed HF solution, and an SC-1 solution.

5. The method of claim 1, further comprising, before forming the first oxide layer, the step of implementing a cleaning process for removing garbage or any native oxides layer remaining on a surface of the semiconductor substrate.

6. The method of claim 5, wherein the cleaning process uses an HF solution mixed with a ratio of 10:1 through 100:1, and an SC-1 solution.

7. A method of forming oxide layer in a semiconductor device, comprising the steps of: forming a first oxide layer on a semiconductor substrate comparted into a low-voltage operational element field and a high-voltage operational element field; removing the first oxide layer from the low-voltage operational element field; forming a passivation oxide layer by oxidizing a surface of the semiconductor substrate in the low-voltage operational element field with an oxidation process, in order to eliminate damages on the surface of the semiconductor substrate in the low-voltage operational element field; removing the passivation oxide layer by means of a pre-cleaning process; and forming a second oxide layer on the low-voltage operational element field.

8. The method of claim 7, further comprising, before forming the first oxide layer, the step of proceeding a cleaning process for removing garbage or a native oxides layer remaining on a surface of the semiconductor substrate.

9. The method of claim 7, wherein the cleaning process uses an HF solution mixed with a ratio of 10:1 through 100:1, and a SC-1 solution.

10. The method of claim 7, wherein the first oxide layer is formed by a wet oxidation process in temperature of 750° C. through 850° C.

11. The method of claim 7, wherein the first oxide layer is formed with thickness of 200 Å through 400 Å.

12. The method of claim 7, wherein the passivation oxide layer is formed with thickness of 20 Å through 100 Å.

13. The method of claim 7, wherein the passivation oxide layer is formed by a wet oxidation process in temperature of 750° C. through 850° C., or by a dry oxidation process in temperature of 800° C. through 1050° C.

14. The method of claim 7, wherein the pre-cleaning process uses at least more one among an $H_2SO_4$ solution, a mixed HF solution, and an SC-1 solution.

15. The method of claim 14, wherein the pre-cleaning process is operable with using the $H_2SO_4$ solution, the mixed HF solution, and the SC-1 solution, in order, with using the SC-1 solution after the mixed HF solution, or with using the mixed HF solution after the SC-1 solution.

16. The method of claim 7, wherein the second oxide is formed by a wet oxidation process in temperature of 750° C. through 850° C., or by a dry oxidation process in temperature of 900° C. through 1100° C.

17. The method of claim 16, further comprising, after forming the second oxide layer, the step of forming the second oxide layer into an oxy-nitride layer by proceeding an annealing process with nitrogen.

18. The method of claim 17, wherein the annealing process with nitrogen is carried out with supply of an NO gas or an $N_2O$ gas, for five through thirty minutes.

19. The method of claim 17, wherein the annealing process is carried out under pressure of 300 Torr through 760 Torr and in temperature of 800° C. through 1100° C.

20. The method of claim 17, wherein the annealing process with nitrogen is carried out in-situ.

* * * * *